United States Patent
Singleton

(10) Patent No.: US 8,657,983 B2
(45) Date of Patent: Feb. 25, 2014

(54) PRE-LAMINATION CORE AND METHOD FOR MAKING A PRE-LAMINATION CORE FOR ELECTRONIC CARDS AND TAGS

(75) Inventor: Robert Singleton, Lakeland, FL (US)

(73) Assignee: Innovatier, Inc., Lakeland, FL (US)

( * ) Notice: Subject to any disclaimer, the term of this patent is extended or adjusted under 35 U.S.C. 154(b) by 377 days.

(21) Appl. No.: 13/074,306

(22) Filed: Mar. 29, 2011

(65) Prior Publication Data

US 2011/0242772 A1   Oct. 6, 2011

Related U.S. Application Data

(60) Provisional application No. 61/320,969, filed on Apr. 5, 2010.

(51) Int. Cl.
*H05K 1/00* (2006.01)
*B29C 47/02* (2006.01)
*C09J 7/02* (2006.01)
*B32B 7/12* (2006.01)

(52) U.S. Cl.
USPC ............... 156/242; 156/244.12; 361/748

(58) Field of Classification Search
USPC .......................................... 156/242
See application file for complete search history.

(56) References Cited

U.S. PATENT DOCUMENTS

| | | | |
|---|---|---|---|
| 4,339,407 A | 7/1982 | Leighton | |
| 4,961,893 A | 10/1990 | Rose | |
| 5,350,553 A | 9/1994 | Gläser et al. | |
| 5,399,847 A | 3/1995 | Droz | |
| 5,417,905 A | 5/1995 | Lemaire et al. | |
| 5,432,705 A | 7/1995 | Severt et al. | |
| 5,498,388 A | 3/1996 | Kodai et al. | |
| 5,510,074 A | 4/1996 | Rose | |
| 6,025,054 A | 2/2000 | Tiffany, III | |
| 2007/0235548 A1* | 10/2007 | Singleton | 235/492 |

FOREIGN PATENT DOCUMENTS

EP   0 350 179 B1   1/1994
EP   0 669 597 B1   8/2002

OTHER PUBLICATIONS

The International Search Report received in the related International Patent Application No. PCT/US2011/022940, dated May 24, 2011.

* cited by examiner

*Primary Examiner* — Philip Tucker
*Assistant Examiner* — Vicki Wu
(74) *Attorney, Agent, or Firm* — Foley & Lardner LLP

(57) ABSTRACT

The disclosed pre-lamination core and the method of making such a pre-lamination core includes an electronic component or a non-electronic component, a bottom cover sheet, a top cover sheet, and a layer of thermosetting material between the bottom and top cover sheets. The pre-lamination core can be used in the manufacture of cards while using conventional equipment to apply top and bottom overlays to the pre-lamination core.

6 Claims, 7 Drawing Sheets

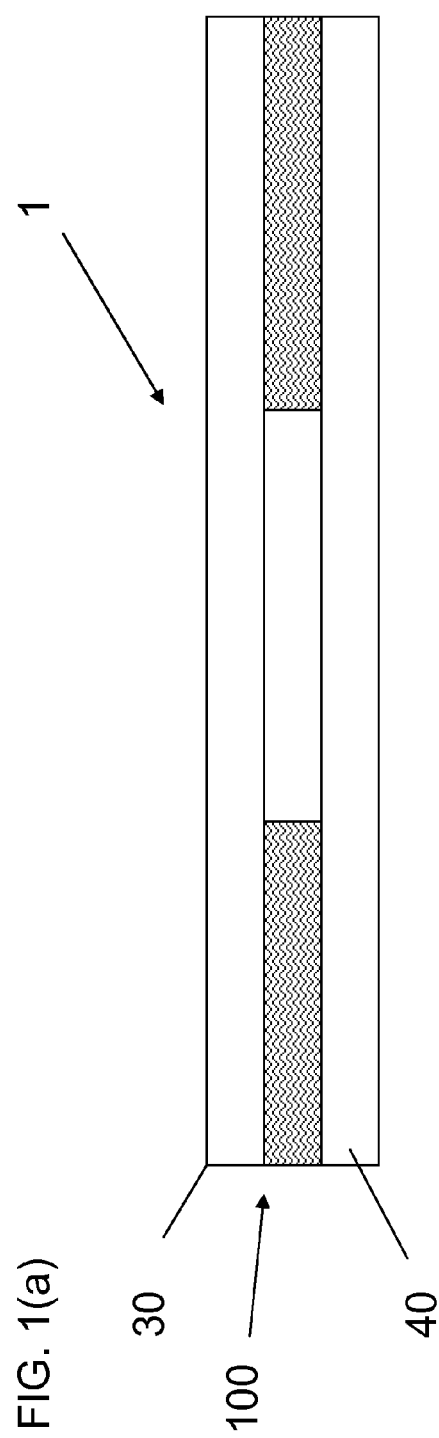
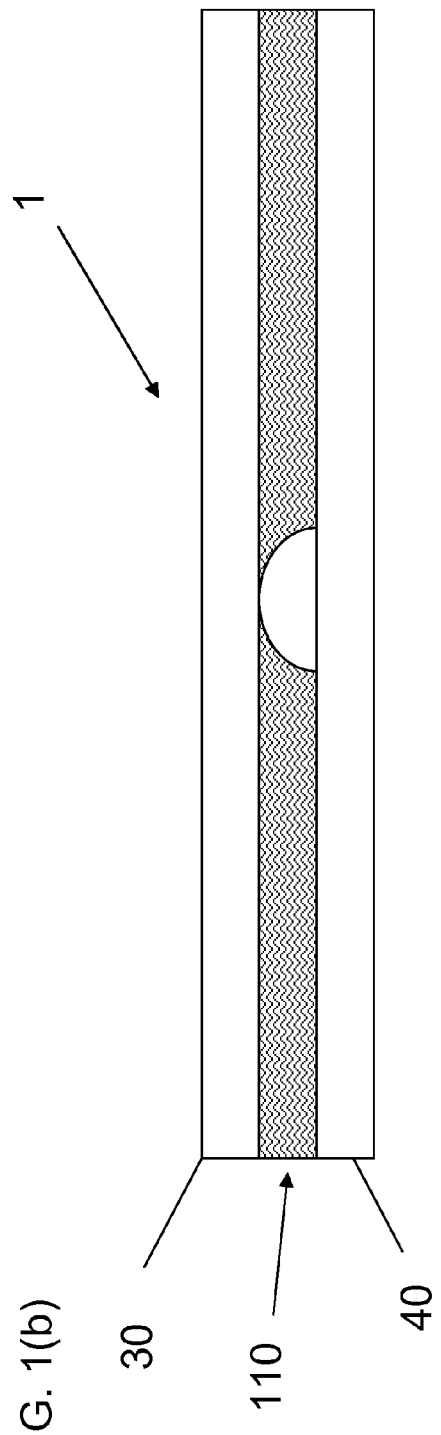

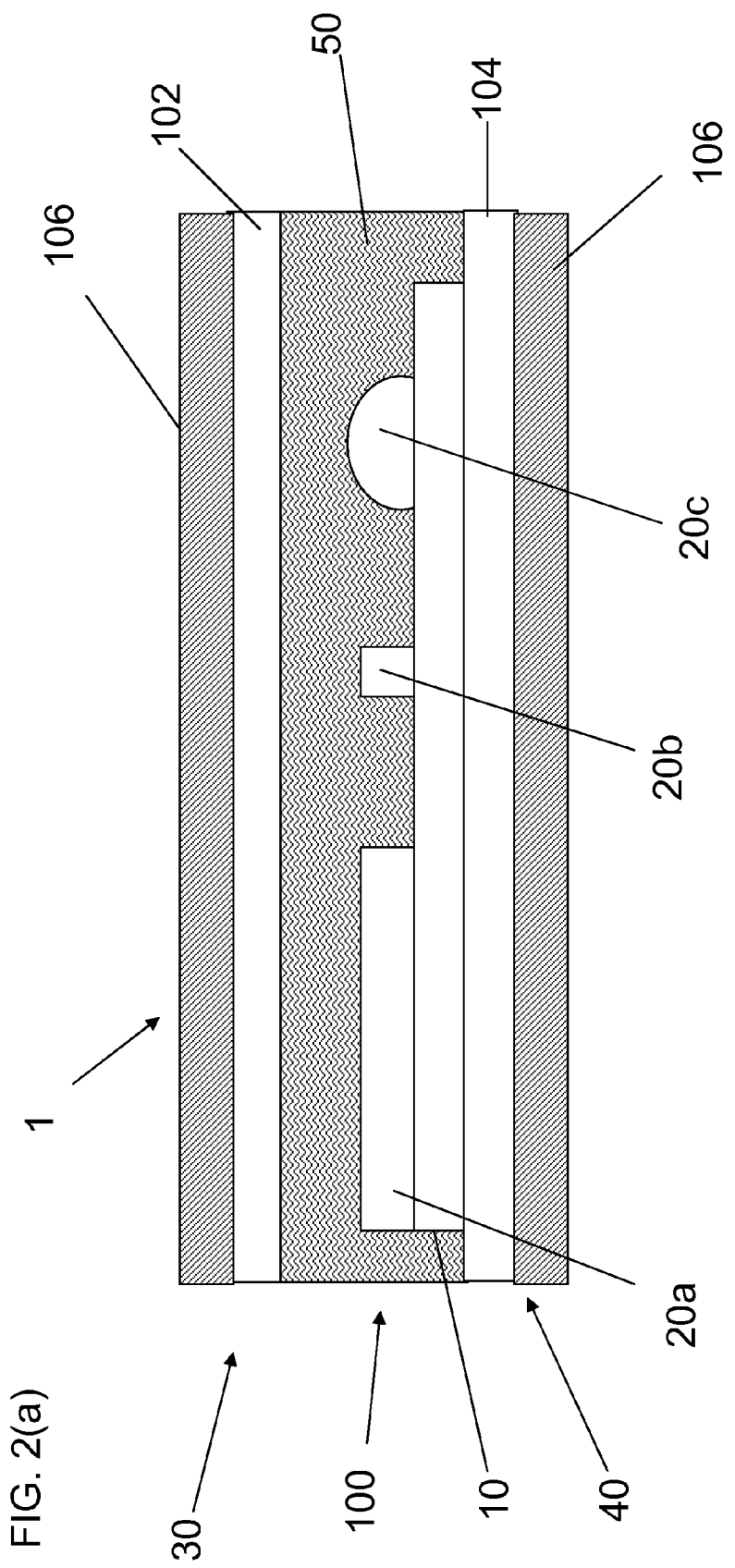

PRE-LAMINATION CORE AND METHOD FOR MAKING A PRE-LAMINATION CORE FOR ELECTRONIC CARDS AND TAGS

CROSS-REFERENCE TO RELATED PATENT APPLICATIONS

This application claims priority from U.S. Provisional Application Ser. No. 61/320,969, filed Apr. 5, 2010.

BACKGROUND

The present invention relates generally to the field of cards and, more particularly, to the field of pre-lamination cores used in cards (e.g., smart cards, ID cards, credit cards, lifestyle cards, etc.) and the method of making such pre-lamination cores.

Generally, cards are constructed by assembling several layers of plastic sheets in a sandwich array. The cards may contain any of one or more electronic components and/or other items that may be desired or enable the card to perform a number of functions.

European Patent 0 350 179 discloses a smart card wherein electronic circuitry is encapsulated in a layer of plastic material that is introduced between the card's two surface layers. The method disclosed further comprises abutting a high tensile strength holding member against a side of a mold, locating the smart card's electronic components with respect to that side and then injecting a reaction moldable polymeric material into the mold such that it encapsulates the electronic components.

European Patent Application 95400365.3 teaches a method for making contact-less smart cards. The method employs a rigid frame to position and fix an electronic module in a void space between an upper thermoplastic sheet and a lower thermoplastic sheet. After the frame is mechanically affixed to the lower thermoplastic sheet, the void space is filled with a polymerizable resin material.

U.S. Pat. No. 5,399,847 teaches a credit card that is comprised of three layers, namely, a first outer layer, a second outer layer and an intermediate layer. The intermediate layer is formed by injection of a thermoplastic binding material that encases the smart card's electronic elements (e.g., an IC chip and an antenna) in the intermediate layer material. The binding material is preferably made up of a blend of copolyamides or a glue having two or more chemically reactive components that harden upon contact with air. The outer layers of this smart card can be made up of various polymeric materials, such as polyvinyl chloride or polyurethane.

U.S. Pat. No. 5,417,905 teaches a method for manufacturing plastic credit cards wherein a mold tool comprised of two shells is closed to define a cavity for producing such cards. A label or image support is placed in each mold shell. The mold shells are then brought together and a thermoplastic material is injected into the mold to form the card. The inflowing plastic forces the labels or image supports against the respective mold faces.

U.S. Pat. No. 5,510,074 teaches a method of manufacturing smart cards having a card body with substantially parallel major sides, a support member with a graphic element on at least one side, and an electronic module comprising a contact array that is fixed to a chip. The manufacturing method generally comprises the steps of: (1) placing the support member in a mold that defines the volume and shape of the card; (2) holding the support member against a first main wall of the mold; (3) injecting a thermoplastic material into the volume defined by the hollow space in order to fill that portion of the volume that is not occupied by the support member; and (4) inserting an electronic module at an appropriate position in the thermoplastic material before the injected material has the opportunity to completely solidify.

U.S. Pat. No. 4,339,407 discloses an electronic circuit encapsulation device in the form of a carrier having walls that have a specific arrangement of lands, grooves and bosses in combination with specific orifices. The mold's wall sections hold a circuit assembly in a given alignment. The walls of the carrier are made of a slightly flexible material in order to facilitate insertion of the smart card's electronic circuitry. The carrier is capable of being inserted into an outer mold. This causes the carrier walls to move toward one another in order to hold the components securely in alignment during the injection of the thermoplastic material. The outside of the walls of the carrier has projections that serve to mate with detents on the walls of the mold in order to locate and fix the carrier within the mold. The mold also has holes to permit the escape of trapped gases.

U.S. Pat. No. 5,350,553 teaches a method of producing a decorative pattern on, and placing an electronic circuit in, a plastic card in an injection molding machine. The method comprises the steps of: (a) introducing and positioning a film (e.g., a film bearing a decorative pattern) over an open mold cavity in the injection molding machine; (b) closing the mold cavity so that the film is fixed and clamped in position therein; (c) inserting an electronic circuit chip through an aperture in the mold into the mold cavity in order to position the chip in the cavity; (d) injecting a thermoplastic support composition into the mold cavity to form a unified card; (e) removing any excess material; (f) opening the mold cavity; and (g) removing the card.

U.S. Pat. No. 4,961,893 teaches a smart card whose main feature is a support element that supports an integrated circuit chip. The support element is used for positioning the chip inside a mold cavity. The card body is formed by injecting a plastic material into the cavity so that the chip is entirely embedded in the plastic material. In some embodiments, the edge regions of the support are clamped between the load bearing surfaces of the respective molds. The support element may be a film that is peeled off the finished card or it may be a sheet that remains as an integral part of the card. If the support element is a peel-off film, then any graphics elements contained therein are transferred and remain visible on the card. If the support element remains as an integral part of the card, then such graphics elements are formed on a face thereof and, hence, are visible to the card user.

U.S. Pat. No. 5,498,388 teaches a smart card device that includes a card board having a through-opening. A semiconductor module is mounted onto this opening. A resin is injected into the opening so that a resin molding is formed under such condition that only an electrode terminal face for external connection of said semiconductor module is exposed. The card is completed by mounting a card board having a through-opening onto a lower mold of two opposing molding dies, mounting a semiconductor module onto the opening of said card board, tightening an upper die that has a gate leading onto a lower die and injecting a resin into the opening via the gate.

U.S. Pat. No. 5,423,705 teaches a disc having a disc body made of a thermoplastic injection molded material and a laminate layer that is integrally joined to a disc body. The laminate layer includes an outer clear lamina and an inner white and opaque lamina. An imaging material is sandwiched between these lamina.

U.S. Pat. No. 6,025,054 discloses a method for constructing a smart card using low shrinkage glue to hold the electronic devices in place during the devices immersion in thermosetting material that becomes the core layer of the smart card.

Generally, all of the above methods involve using specialized equipment for the assembly of printed overlays that are deposited over the electronics. In view of this drawback, there is a need for the ability to present a pre-lamination core that can be self-contained and capable of shipment to card manufacturing companies for incorporation into a variety of different electronic cards. In addition, there is a need for the ability to make pre-lamination cores that are capable of being incorporated into electronic cards through the use of conventional card making equipment in which printed overlays and laminate can be applied to the pre-lamination core.

SUMMARY

According to one embodiment of the present invention, a pre-lamination core used in a card is provided. The pre-lamination core may comprise a circuit or non-electronic component, a bottom cover sheet wherein the bottom cover sheet comprises a heat seal material attached to a carrier sheet, a top cover sheet positioned above the circuit or non-electronic component, wherein the top cover sheet comprises a heat seal material attached to a carrier sheet and a layer of thermosetting material between the bottom cover sheet and the top cover sheet. The overall thickness of the pre-lamination core can be less than 0.050 inches, or less than 0.010 inches, without the carrier sheets.

According to another embodiment of the present invention, a card is disclosed that comprises a pre-lamination core, a top overlay, and a bottom overlay. The pre-lamination core may comprise a circuit or a non-electronic item attached to a bottom cover sheet, wherein the bottom cover sheet comprises a heat seal material attached to a carrier sheet, a top cover sheet positioned above the circuit or non-electronic item, wherein the top cover sheet comprises a heat seal material attached to a carrier sheet and a layer of thermosetting material between the bottom cover sheet and the top cover sheet. A top overlay can be heat laminated to a top surface of the pre-lamination core while a bottom overlay can be heat laminated to a bottom surface of the pre-lamination core.

According to another embodiment of the present invention, a method for manufacturing a pre-lamination core is disclosed that comprises the steps of: providing a circuit or a non-electronic item, affixing the circuit or non-electronic item to a bottom cover sheet, wherein the bottom cover sheet comprises a heat seal material attached to a carrier sheet, loading the circuit or non-electronic item and bottom cover sheet into an injection molding apparatus, loading a top cover sheet into the injection molding apparatus, wherein the top cover sheet comprises a heat seal material attached to a carrier sheet, and injecting a thermosetting polymeric material between the top and bottom cover sheets.

According to yet another embodiment, a method for manufacturing a card is disclosed that comprises the steps of: providing a circuit or non-electronic item, affixing the circuit or non-electronic item to a bottom cover sheet, wherein the bottom cover sheet comprises a heat seal material attached to a carrier sheet, loading the circuit and non-electronic item and the bottom cover sheet into an injection molding apparatus, loading a top cover sheet positioned above the circuit and non-electronic item into the injection molding apparatus, wherein the top cover sheet comprises a heat seal material attached to a carrier sheet, injecting a thermosetting polymeric material between the top and bottom cover sheets to make a pre-lamination core, removing the pre-lamination core from the injection molding apparatus, separating the carrier sheets from the heat seal materials and providing a top overlay and a bottom overlay for heat lamination to the pre-lamination core.

In one embodiment, the method of making a card comprises placing the pre-lamination core between the top overlay and the bottom overlay to create an assembly, placing the assembly in a laminator and performing a hot lamination process on the assembly.

It is to be understood that both the foregoing general description and the following detailed descriptions are exemplary and explanatory only, and are not restrictive of the invention as claimed.

BRIEF DESCRIPTION OF THE DRAWINGS

These and other features, aspects and advantages of the present invention will become apparent from the following description, appended claims, and the accompanying exemplary embodiments shown in the drawings, which are briefly described below.

FIG. 1(a) shows a cross sectional view of a pre-lamination core for a card according to an embodiment of the present invention.

FIG. 1(b) shows a cross sectional view of a pre-lamination core for a card according to an embodiment of the present invention.

FIG. 2(a) shows a cross sectional view of a card having a pre-lamination core according to an embodiment of the present invention.

DETAILED DESCRIPTION

Figure 2B:
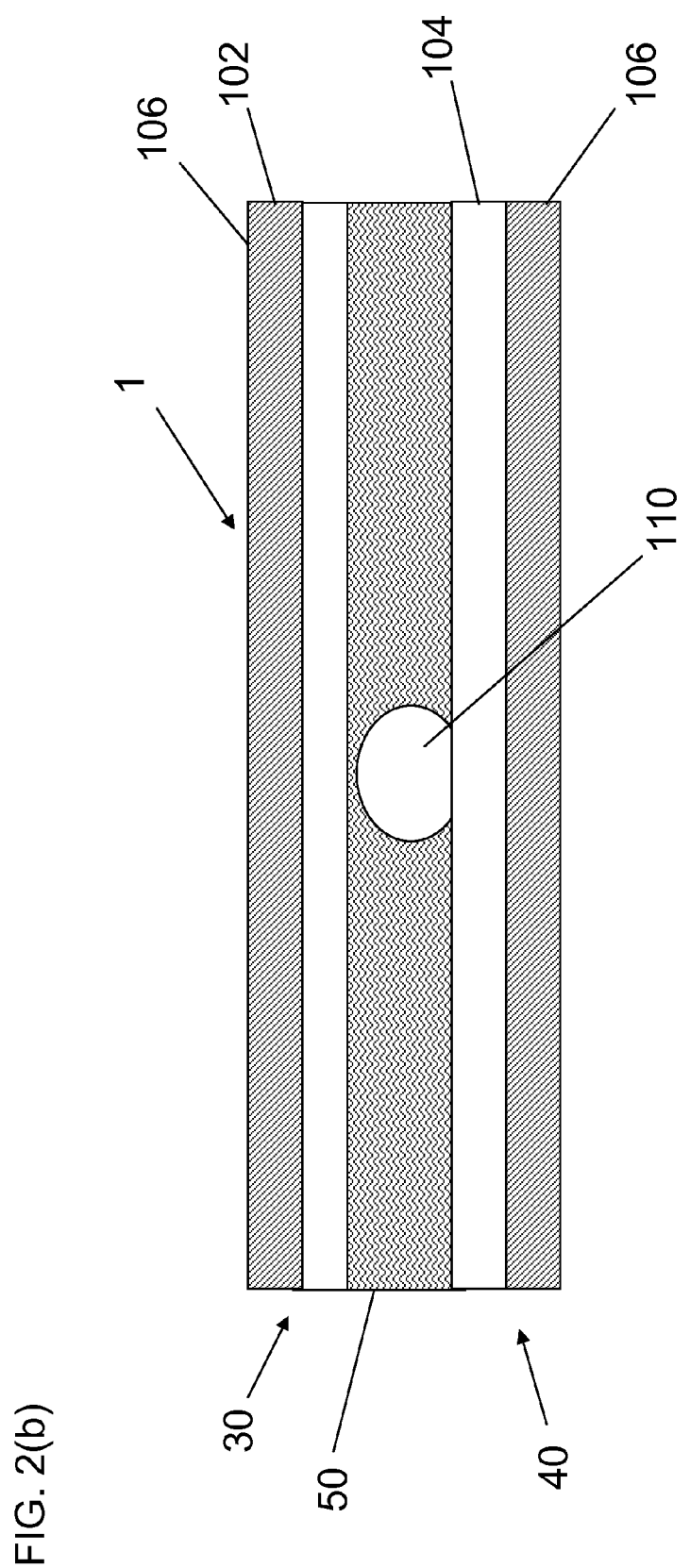
FIG. 2(b) shows a cross sectional view of a card having a pre-lamination core according to an embodiment of the present invention.

According to one embodiment of the present invention, as shown in FIGS. 1(a) and 2(a), a pre-lamination core 1 may comprise an electronic circuit 100, a bottom cover sheet 40, comprising a layer of heat seal material 104 attached to the bottom of the electronic circuit 100, and a top cover sheet 30, comprising a layer of heat seal material 102 positioned above the electronic circuit 100. According to another embodiment, FIG. 1(b) shows a pre-lamination core 1 comprising a non-electronic item 110 instead of an electronic circuit 100.

As seen in FIG. 2(a), according to one embodiment, the pre-lamination core 1 having the electronic circuit 100 may comprise a circuit board 10, a plurality of circuit components 20a-20c, a layer of thermosetting material 50, a top cover sheet 30, and a bottom cover sheet 40. According to one embodiment, the circuit board 10 has a top surface and a bottom surface. According to one embodiment of the invention, the circuit board 10 can be double-sided. Accordingly, the circuit board 10 may be configured to accommodate a plurality of circuit traces 14 (shown in FIG. 4) on the top surface and on the bottom surface. The circuit traces 14 are configured to operably connect the plurality of circuit components 20a-20c affixed to the circuit board 10. The circuit traces 14 electrically connect to the plurality of circuit components 20a-20c such that the circuit components are capable of performing electrical functions within the electronic card 1. The circuit board 10 is comprised of any known conventional material suitable for receiving an electronic circuit. For example, the circuit board 10 may be comprised of a flame retardant laminate with a woven glass reinforced epoxy resin. This material is also known as FR-4 board. Alternatively, the circuit board 10 may be comprised of a plastic compound that is suitable for receiving conductive ink, such as polyester.

For example purposes only, the plurality of circuit components 20a-20c could be one of a battery, an LED, a button or switch. In addition, any one or all of these circuit components could populate the circuit board 10. Further, additional circuit components 20a-20c may include but are not limited to a microprocessor chip, a speaker, a plurality of LEDs, flexible displays, RFID antennas and emulators.

According to one embodiment and as shown in FIG. 2(b), instead of a circuit 100, the pre-lamination core 1 comprises a non-electronic item 110. The bottom cover sheet 40 can be attached to the bottom of the printed circuit board 10 or non-electronic item 110 by any number of known methods. Preferably, the bottom cover sheet is attached to the printed circuit board 10 or non-electronic item 110 with spray-on adhesive. According to one embodiment, the adhesive may be any type of suitable adhesive, such as a pressure-sensitive adhesive, a heat-activated adhesive, a chemically-activated adhesive, etc. The adhesive may be a variety of forms, such as a tape, a film, or as a sprayed liquid. The top cover sheet 30 is positioned above the top surface of the printed circuit board 10 or non-electronic item 110. The top cover sheet 30 comprises the top layer of heat seal material 102 attached to a carrier sheet of polyethylene 106. Preferably, the heat seal material is coated on to the carrier sheet. The bottom cover sheet 40 comprises the bottom layer of heat seal material 104 attached to a carrier sheet of polyethylene 106. Preferably, the carrier sheets of polyethylene are attached to the heat seal materials 102, 104 in such a way that they loosely adhere to the heat seal materials 102, 104. According to one embodiment, the carrier sheets 106 may be comprised of any one of paper with a silicone or wax coating, polypropylene, polycarbonate or polyethylene. Generally, the heat seal material 102, 104 is an adhesive coating film. Preferably, the heat seal material 102, 104 is aliphatic polyester water-based urethane adhesive coating film which provides adhesion to various materials, including but not limited to vinyl, polyester, polyolefin, etc. In addition, the heat seal material 102, 104 can be any one of a W31 coating, W35 coating, W39 coating or W45 coating manufactured by Waytek.

As shown in FIGS. 2(a)-(b), a layer of thermosetting material 50 is positioned between the top cover sheet 30 and the bottom cover sheet 40. In FIG. 2(a), the layer of thermosetting material 50 encloses the electronic circuit 100. In FIG. 2(b), the layer of thermosetting material 50 encloses the non-electronic component 110. Preferably the layer of thermosetting material 50 is composed of a thermosetting polymeric material. For example, the layer of thermosetting material 50 can be composed of polyurea.

Polyurea is a known elastomer that is derived from the reaction product of an isocyanate component and a resin blend component. The isocyanate can be aromatic or aliphatic in nature. It can be a monomer, a polymer, or any variant reaction of isocyanates, quasi-prepolymer or a prepolymer. The prepolymer, or quasi-prepolymer, can be made of an amine-terminated polymer resin or a hydroxyl-terminated polymer resin. The resin blend must be made up of amine-terminated polymer resins, and/or amine-terminated chain extenders. The amine-terminated polymer resins will not have any intentional hydroxyl moieties. Any hydroxyls are the result of an incomplete conversion to the amine-terminated polymer resins. The resin blend may also contain additives or non-primary components. These additives may contain hydroxyls, such as pre-dispersed pigments in a polyol carrier. Normally, the resin blend will not contain a catalyst(s).

Using a polyurea formulation, such as a pure polyurea, as the layer of thermosetting material 50 allows the pre-lamination core 100 to withstand the hot lamination temperatures used in the hot lamination process when the top and bottom overlays are added to the pre-lamination core 100 to form the pre-lamination core 1. Such hot lamination temperatures can include the range of 250 to 300° F.

Generally, the components shown in FIGS. 1(a)-3(b) may vary in thickness and length. For example, the pre-lamination core 1 can have a thickness of less than 0.03 inches. However, the overall thickness of the pre-lamination core 1 is preferably between 0.016 and 0.028 inches. Accordingly, these dimensions allow the pre-lamination core 1 to be compatible with the conventional equipment used by certified financial card institutions which will laminate product-specific bottom and top overlays to the heat seal material 102 and 104.

In particular for the purpose of producing a card that meets ISO 07816 standards, the finished card cannot exceed 0.033 inches (or 0.76 mm) in thickness. Thus, the thicknesses of the top and bottom overlays used by the certified financial houses and the pre-lamination core 1 cannot be considered independent of each other. For example, if the top and bottom overlays used by the certified financial houses are 0.007 inches thick then the pre-lamination core 1 thickness cannot exceed 0.019 inches. If, however, the top or bottom overlay is less than 0.007 inches thick, then the electronic pre-lamination core 1 thickness can be larger as long as the combination of the thickness of the top overlay and the bottom overlay, and the pre-lamination core 1 do not exceed 0.033 inches.

Figure 5:
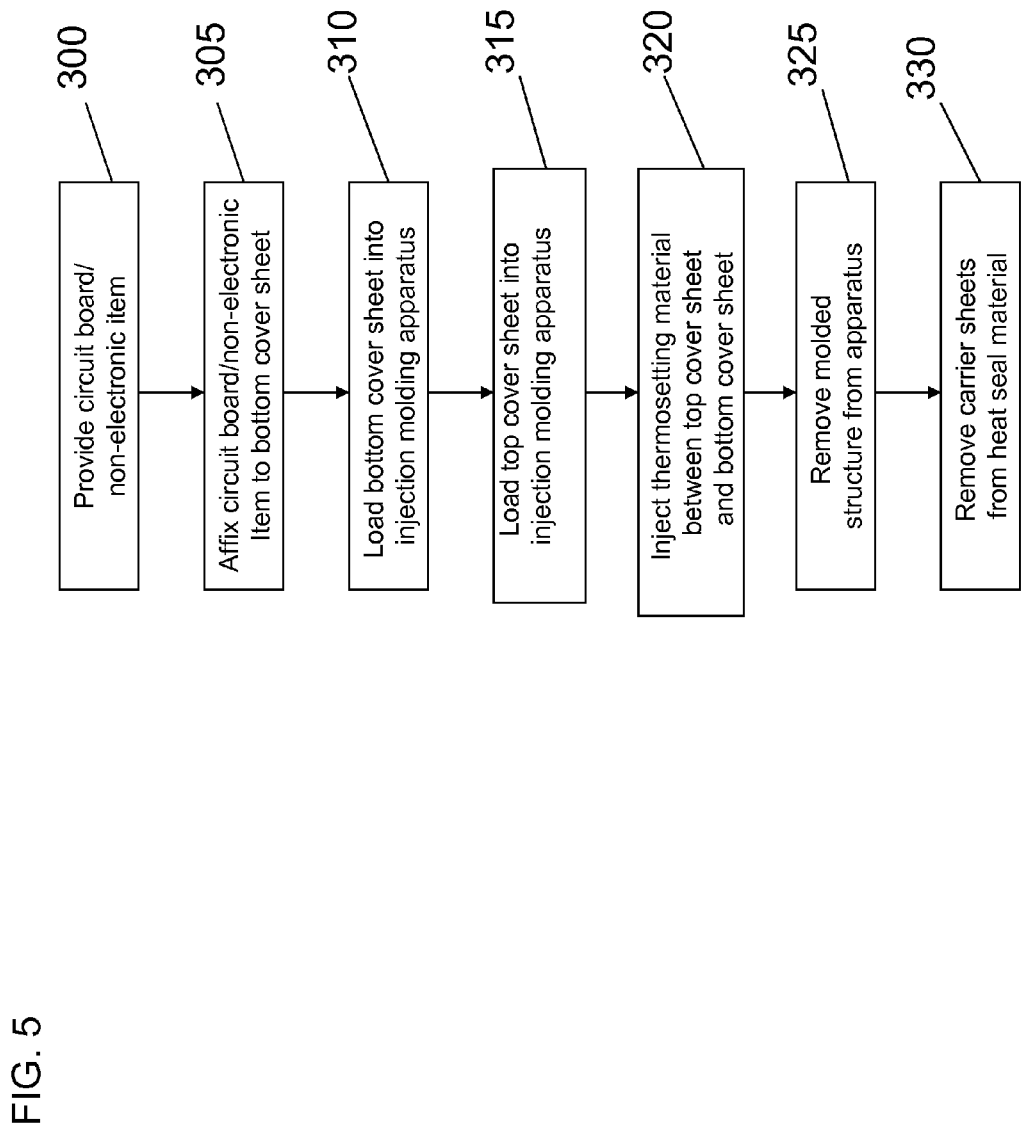
FIG. 5 is a flow chart for manufacturing a pre-lamination core according to one embodiment.

A method for manufacturing an electronic pre-lamination core 1 according to the present invention will now be described with respect to FIG. 5.

First, in step 300, a circuit board 10 is provided which may include a plurality of components 20a-20c. The circuit board 10 has a top surface and a bottom surface. In the alternative and as shown in FIGS. 1(b), 2(b) and 3(b) a non-electronic item 110 such as a medallion, emblem, decorative design, or other non-electronic item may be provided.

Next, in step 305, the bottom surface of the circuit board 10 is affixed to the bottom cover sheet 40. Preferably, the bottom surface of the circuit board is attached to the bottom cover sheet 30 using a spray-on adhesive. According to another embodiment, the non-electronic item 110 is affixed with adhesive (preferably with spray-on adhesive) to the bottom cover sheet 40. According to one embodiment the spray-on adhesive may be cyanoacrylate.

In step 310, the circuit board 10, attached to the bottom cover sheet 40 or non-electronic item 110 attached to the bottom cover sheet 40 are then loaded as one complete sheet into an injection molding apparatus. In step 315, a top cover sheet 30 is placed into the injection molding apparatus and positioned such that the top cover sheet 30 is above the top surface of the circuit board 10 or non-electronic item 110 and the bottom cover sheet 40. Specifically, the injection molding apparatus may be a reaction injection molding machine ("which is often individually referred to as "RIM").

Figure 3A:
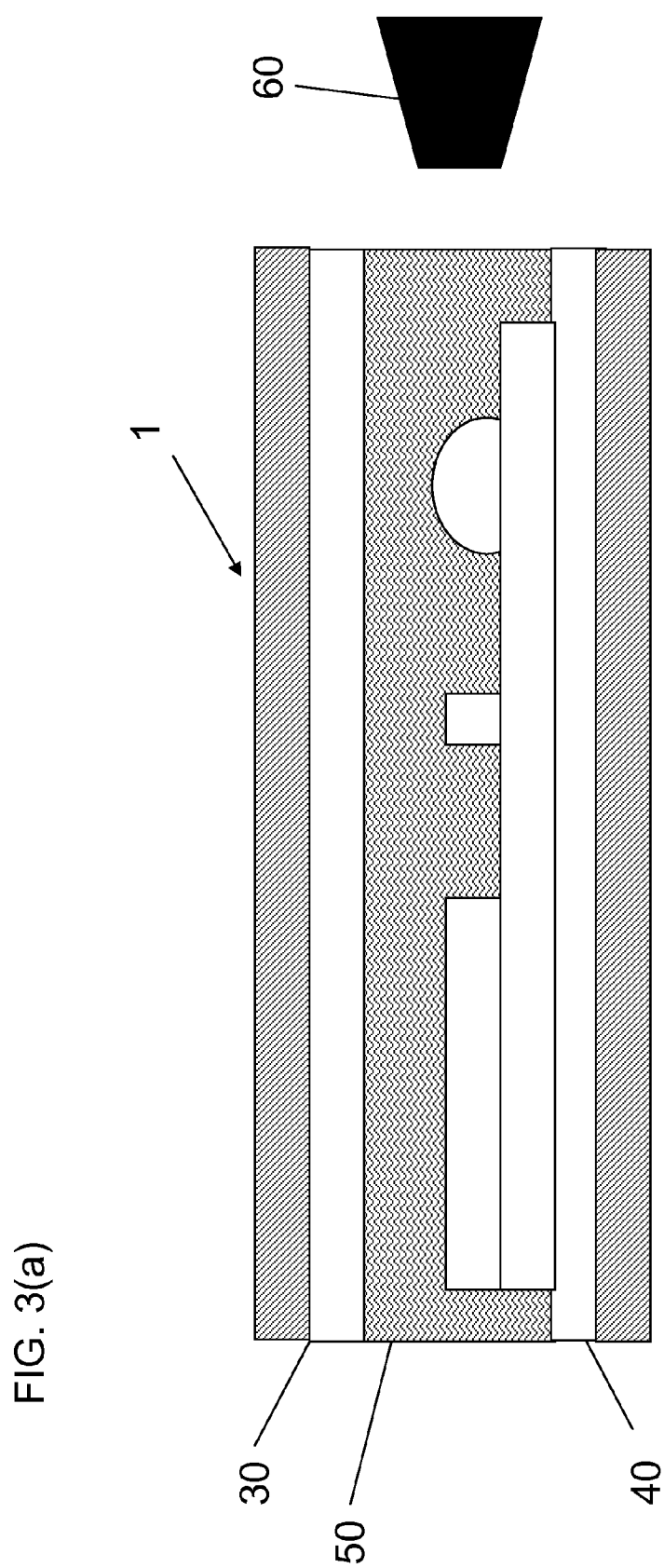
FIG. 3(a) shows a cross sectional view of an electronic pre-lamination core with a nozzle used to inject thermosetting material between the top and bottom cover sheets.
Figure 3B:
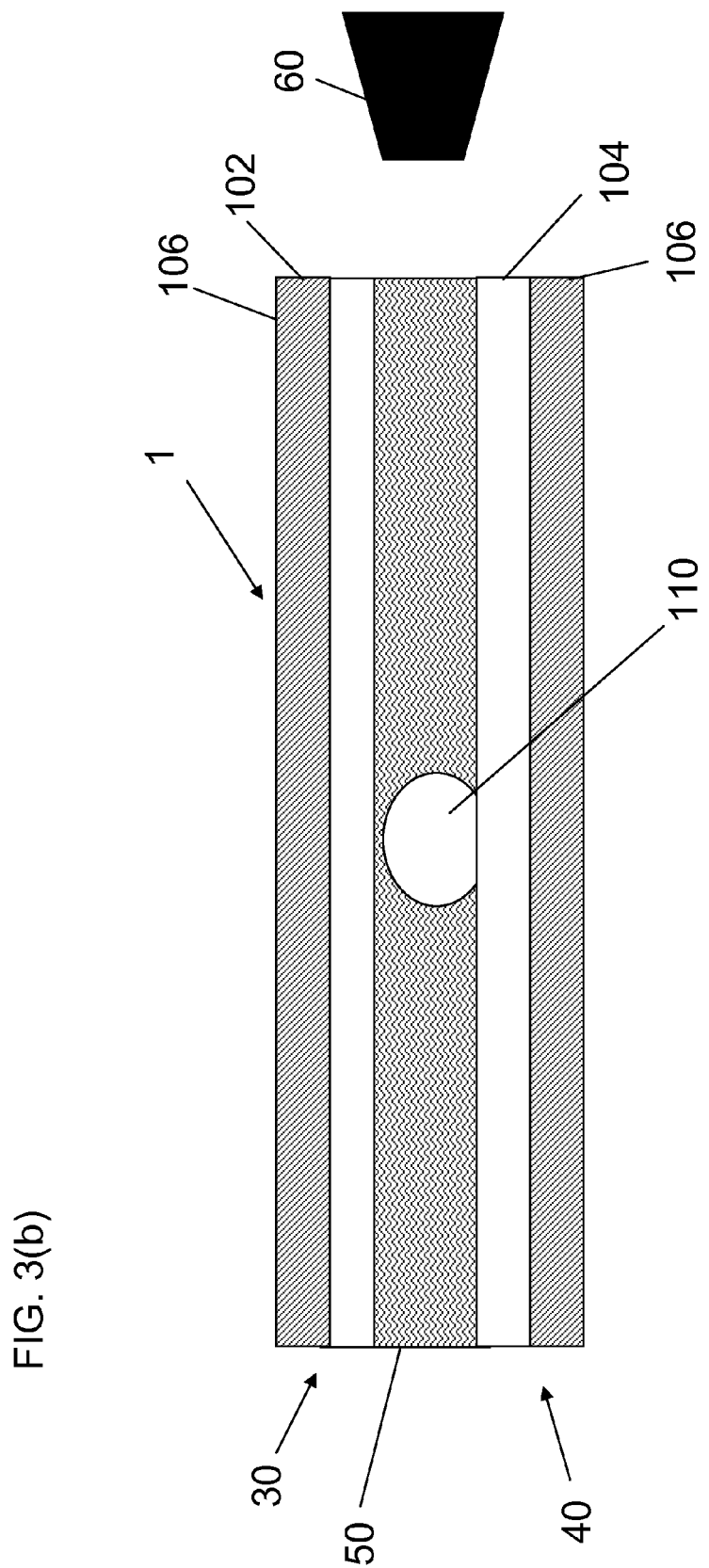
FIG. 3(b) shows a cross sectional view of an electronic pre-lamination core with a nozzle used to inject thermosetting material between the top and bottom cover sheets.

The injection molding apparatus closes and then in step 320, under cold, low pressure forming conditions, injects thermosetting polymeric material via a nozzle 60 (shown in FIGS. 3(a)-3(b)) between the top cover sheet 30 and the circuit board 10 or non-electronic item 110 attached to the bottom cover sheet 40, and the bottom cover sheet 30 forming the layer of thermosetting material 50 from the thermosetting polymeric material. Preferably, as mentioned above, the thermosetting polymeric material can be polyurea but other suitable materials can be used.

Cold, low pressure forming conditions generally mean forming conditions wherein the temperature of the thermosetting polymeric material, is less than the heat distortion temperature of the top cover sheet 30 and the bottom cover sheet 40 and the circuit board 10 or non-electronic item 110 attached to the bottom cover sheet 40, and the pressure is less than about 500 psi. Preferably, the cold forming temperatures will be at least 100° F. less than the heat distortion temperature of the top cover sheet 30 and the bottom cover sheet 40 and the circuit board 10 or non-electronic item 110 attached to the bottom cover sheet 40.

According to one embodiment of the invention, the more preferred cold, low pressure forming procedures will involve injection of thermosetting polymeric materials with temperatures ranging from about 100° F. to about 160° F., under pressures that preferably range from about atmospheric pressure to about 500 psi.

Figure 4:
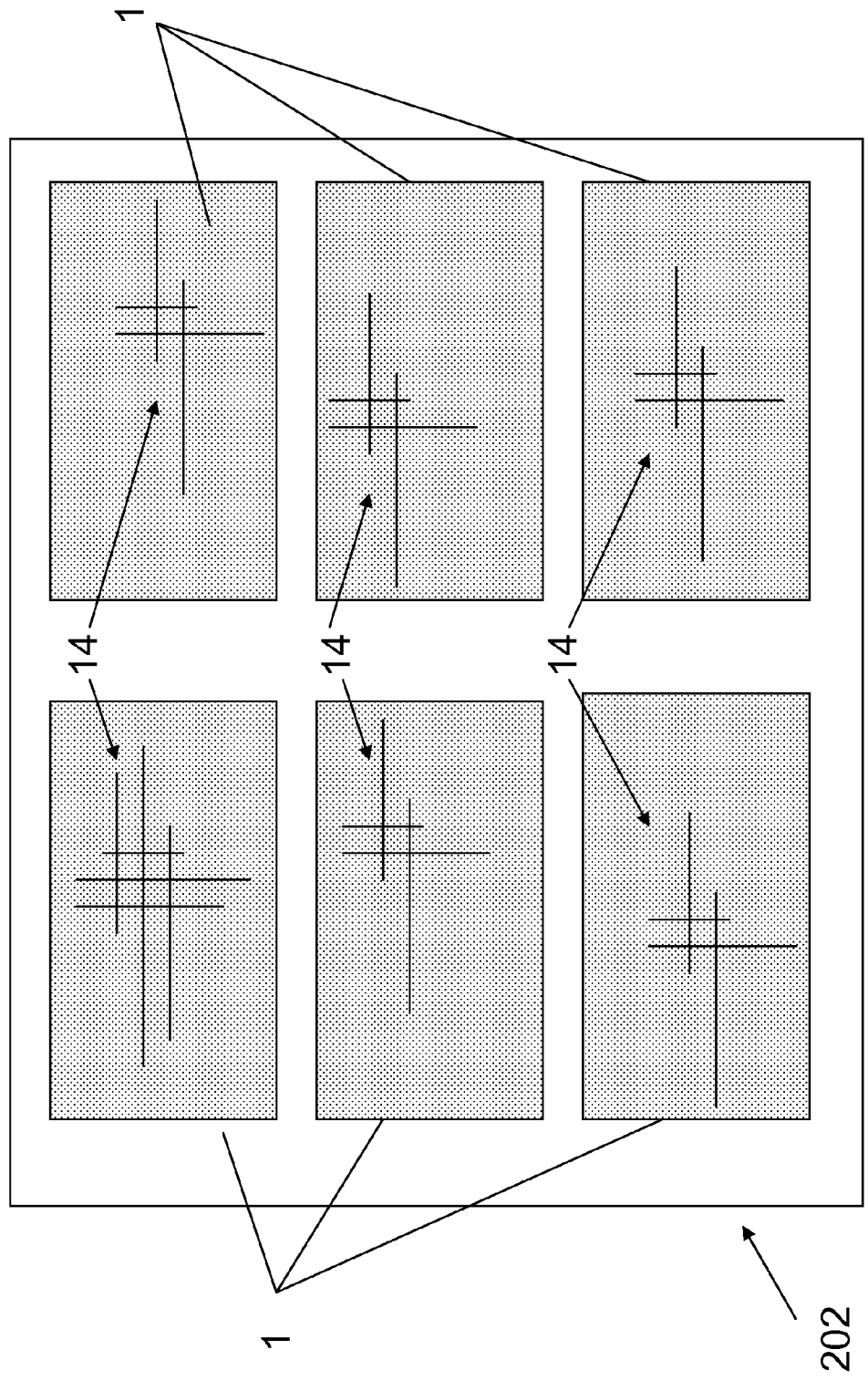
FIG. 4 shows a top view of an assembly comprising an pre-lamination core, a top overlay, and a bottom overlay in a laminator according to an embodiment of the present invention.

After the injection of the thermosetting polymeric material, in step 325 the molded structure is then removed from the injection molded apparatus. In step 330 for each of the top cover sheet 30 and the bottom cover sheet 40 the polyethylene carrier sheets 106 are removed from the top layer of heat seal material 102 and the bottom layer of heat seal material 104. According to one embodiment of the invention, several pre-lamination cores 1 are formed in one molded sheet 202. FIG. 4 depicts several pre-lamination cores 1 formed in one sheet 202. According to other embodiments, the injected sheet can correspond to a single pre-lamination core 1, a single strip or row of pre-lamination cores 1, or an array of pre-lamination cores 1. For example, the injected sheet can include three rows of seven pre-lamination core 1, which can allow existing card manufacturers to produce electronic cards using their existing equipment and processes that they use today.

The sheet 202 of the pre-lamination core(s) 1 may then be shipped to card manufacturers where top and bottom overlays are applied to the sheet 202 of pre-lamination core(s) 1 to form a card. The top and bottom overlays may be comprised of any suitable material but preferably, they are comprised of polyvinyl chloride (PVC) or like material. According to one embodiment of the invention, a surface of the overlay has printed information. For example, the overlays may include printed information consistent with a standard credit card, including a name, expiration date, and account number.

According to another embodiment of the invention, the top and bottom overlays may be clear or "⅖ clear/white printed." "⅖ clear/white printed" means that the overlay comprises a 0.005" printed white PVC layer with a 0.002" clear laminate over the printed surface of the 0.005" layer. Of course, other types of overlays can be used such as a printed white PVC layer that is less than 0.005" thick and/or a clear laminate layer that is less than 0.002" thick.

Card manufacturers may receive the sheet 202 of pre-lamination core(s) 1 and use a hot lamination process to attach their top and bottom overlays to the sheet 202 of pre-lamination core(s) 1. The layer of heat seal materials 102, 104 will facilitate the hot lamination process to attach the overlays. Thus, a company that produces credit cards, for example, can easily make electronic cards in a more cost effective manner since there is a reduction in equipment costs.

Given the disclosure of the present invention, one versed in the art would appreciate that there may be other embodiments and modifications within the scope and spirit of the invention. Accordingly, all modifications attainable by one versed in the art from the present disclosure within the scope and spirit of the present invention are to be included as further embodiments of the present intention. The scope of the present invention is to be defined as set forth in the following claims.

What is claimed is:

1. A method for manufacturing a pre-lamination core, comprising:
providing a circuit board having a top surface and a bottom surface;
affixing a plurality of circuit components onto the top surface of the circuit board;
affixing the bottom surface of the circuit board to a bottom cover sheet using an adhesive, wherein the bottom cover sheet comprises a heat seal material attached to a carrier sheet;
loading the circuit board and bottom cover sheet into an injection molding apparatus;
loading a top cover sheet positioned above a top surface of the circuit board into the injection molding apparatus, wherein the top cover sheet comprises a heat seal material attached to a carrier sheet;
injecting a thermosetting polymeric material between the top and bottom cover sheets to form the pre-lamination core; and
removing the pre-lamination core from the injection molding apparatus; and
separating the carrier sheets from the heat seal materials of the top cover sheet and bottom cover sheet.

2. A method for manufacturing a card, comprising:
providing a circuit board having a top surface and a bottom surface;
affixing a plurality of circuit components onto the top surface of the circuit board;
affixing the bottom surface of the circuit board to a bottom cover sheet using an adhesive, wherein the bottom cover sheet comprises a heat seal material attached to a carrier sheet;
loading the circuit board and bottom cover sheet into an injection molding apparatus;
loading a top cover sheet positioned above a top surface of the circuit board into the injection molding apparatus, wherein the top cover sheet comprises a heat seal material attached to a carrier sheet;
injecting a thermosetting polymeric material between the top and bottom cover sheets to form a pre-lamination core; and
removing the pre-lamination core from the injection molding apparatus;
separating the carrier sheets from the heat seal materials of the top cover sheet and bottom cover sheet; and
providing a top overlay and a bottom overlay for heat lamination to the pre-lamination core.

3. The method of claim 2, wherein the thermosetting polymeric material comprises polyurea.

4. The method of claim 2, further comprising:
placing the pre-lamination core between the top overlay and the bottom overlay to create an assembly;
placing the assembly in a laminator; and
performing a hot lamination process on the assembly.

5. A method for manufacturing a pre-lamination core, comprising:

provding a non-electronic item;

affixing the non-electronic item to a bottom cover sheet using an adhesive, wherein the bottom cover sheet comprises a heat seal material attached to a carrier sheet;

loading the non-electronic item and bottom cover sheet into an injection molding apparatus;

loading a top cover sheet positioned above a top surface of the circuit board into the injection molding apparatus, wherein the top cover sheet comprises a heat seal material attached to a carrier sheet;

injecting a thermosetting polymeric material between the top and bottom cover sheets to form the pre-lamination core;

removing the pre-lamination core from the injection molding apparatus; and separating the carrier sheets from the heat seal materials of the top cover sheet and bottom cover sheet.

6. A method for manufacturing a card, comprising:

providing a non-electronic item;

affixing the non-electronic item to a bottom cover sheet using an adhesive, wherein the bottom cover sheet comprises a heat seal material attached to a carrier sheet;

loading the non-electronic item and bottom cover sheet into an injection molding apparatus;

loading a top cover sheet positioned above a top surface of the non-electronic item into the injection molding apparatus, wherein the top cover sheet comprises a heat seal material attached to a carrier sheet;

injecting a thermosetting polymeric material between the top and bottom cover sheets to form a pre-lamination core;

removing the pre-lamination core from the injection molding apparatus;

separating the carrier sheets from the heat seal materials of the top cover sheet and bottom cover sheet; and providing a top overlay and a bottom overlay for heat lamination to the pre-lamination core.

* * * * *